United States Patent [19]
Kawahara et al.

[11] Patent Number: 5,506,154
[45] Date of Patent: Apr. 9, 1996

[54] PROCESS FOR PREHEAT TREATMENT OF SEMICONDUCTOR WAFERS

[75] Inventors: Hiroyuki Kawahara; Mitsuo Kono, both of Hiratsuka, Japan

[73] Assignee: Komatsu Electronic Metals Co., Ltd., Kanagawa, Japan

[21] Appl. No.: 30,251

[22] PCT Filed: Sep. 11, 1991

[86] PCT No.: PCT/JP91/01205

§ 371 Date: Jul. 9, 1993

§ 102(e) Date: Jul. 9, 1993

[87] PCT Pub. No.: WO92/05578

PCT Pub. Date: Apr. 2, 1992

[30] Foreign Application Priority Data

Sep. 14, 1990 [JP] Japan ................. 2-242558

[51] Int. Cl.⁶ ................................. H01L 21/322
[52] U.S. Cl. ................................. 437/10; 437/247
[58] Field of Search ............... 430/10, 11, 12, 430/13; 148/DIG. 29, DIG. 60; 437/247, 117

[56] References Cited

U.S. PATENT DOCUMENTS

| | | | |
|---|---|---|---|
| 4,376,657 | 3/1983 | Nagasawa et al. | 437/10 |
| 4,851,358 | 7/1989 | Huber | 437/10 |
| 4,868,133 | 9/1989 | Huber | 437/10 |
| 5,385,115 | 1/1995 | Tomioka et al. | 437/10 |
| 5,419,786 | 5/1995 | Kokawa et al. | 437/10 |

FOREIGN PATENT DOCUMENTS

| | | | |
|---|---|---|---|
| 0066461A2 | 5/1981 | European Pat. Off. | 437/10 |
| 58-159334 | 9/1983 | Japan | 437/10 |
| 127232A | 1/1984 | Japan | 437/10 |
| 61-8930 | 1/1986 | Japan . | |
| 62-76714A | 4/1987 | Japan | 437/10 |

OTHER PUBLICATIONS

Proceedings of the 12th Conference on Solid State Devices, Tokyo, 1980; Japanese Journal of Applied Physical, vol. 20 (1981), Supplement 20–1, pp. 25–30.
Applied Physics, vol. 49, No. 1 (1980), pp. 90–96.

*Primary Examiner*—George Fourson
*Assistant Examiner*—S. Mulpuri
*Attorney, Agent, or Firm*—Larson & Taylor

[57] ABSTRACT

In manufacturing a semiconductor device, when a SORI limit value of a silicon single crystal wafer to be material in manufacturing devices, and a bulk micro defect density are defined in fixed ranges for said wafer, as required by the device yield and the gettering capability, said wafer having an initial oxygen concentration capable of simultaneously satisfying said fixed ranges is subject to a preheat treatment for the formation of an oxygen precipitate nucleus by using a time capable of simultaneously satisifying a fixed range between the upper and lower limit values of said initial oxygen concentration and the fixed range of said bulk micro defect density. Use of the process of the present invention will make it possible that the SORI of a wafer is limited to its lowest extent, and a combination of a variety of conditions for insuring the BMD density required for exertion of a desired gettering capability is efficiently chosen in a short period of time without relying upon trial and error.

2 Claims, 6 Drawing Sheets

PROCESS FOR PREHEAT TREATMENT OF SEMICONDUCTOR WAFERS

INDUSTRIAL FIELD OF THE INVENTION

This invention relates to a process for manufacturing semiconductor devices, and more particularly to a technique in which there is taken advantage of a relationship among the initial oxygen concentration (hereinafter called initial Oi) of a wafer, the SORI of the wafer in heat treatment process, and the Bulk Micro Defect density (hereinafter called BMD density), to limit, to the minimum extent the SORI of the wafer, which is caused by the heat treatment subjected to during the manufacturing process of elements and to retain the BMD density required for a gettering action whereby the device yield is improved.

PRIOR ART

In manufacturing semiconductor elements using a silicon single crystal as a substrate a variety of gettering methods have been conventionally developed and used to improve the yield.

Particularly, the so-called intrinsic gettering (hereinafter called IG) is generally well employed as a method of clean gettering, said IG using as a gettering site the bulk micro defects which generate in the wafer in the heat treatment process, being caused by the supersaturated oxygen involved in a CZ silicon single crystal. The IG capability is closely concerned with the BMD density, and the different kinds of elements require their respective IG capabilities correspondingly. In short, depending on the kind of devices the optimum BMD density for the wafer is required.

On the other hand, the initial Oi of a CZ silicon single crystal wafer commonly used is in the range $12 \times 10^{17}$ to $18 \times 10^{17}$ atoms/cc, and to obtain the optimum BMD density a preheat treatment is carried out for the production of an oxygen precipitate nucleus at 600°–900° C. depending on the initial Oi of the wafers of the respective substrates.

In the wafer which can be internally generated with the BMD density determined by the gettering capability by the heat treatment in the manufacturing process of the semiconductor devices, a thermal stress often occurs due to the temperature gradient within the wafer face, following the insertion into and drawing from the heat treatment furnace, when a displacement and propagation takes place in the wafer by the bulk micro defects thereby deforming the wafer not a little whereby a SORI or a slip of continuous defects generates. The portion thus slipped deteriorates the characteristics of the devices. On the other hand, even the SORI of a wafer brings about a pattern slip in the fine processing such as mask mating. Thus both the SORI and slipping lower the device yield.

SUBJECT MATTER OF THE INVENTION

The present invention has been made to solve the above problems, and it is characterized in that when the limit value of the SORI of the wafer after passing the device process, and the BMD density, are specified in predetermined ranges for a silicon single crystal to be a device, being required by the device yield and the gettering capability in making a semiconductor device, said wafer having the initial Oi sufficient to simultaneously satisfy said predetermined ranges, is subjected to a preheat treatment by using a time that can simultaneously satisfy a predetermined range between the upper limit and lower limit values of said initial Oi and the predetermined range of said BMD density.

In other words, there is previously obtained, for each group of silicon wafers in plurality having different initial oxygen concentrations, a relation between the BMD density within the wafers in the heat treatment in said device making process or the simulation heat treatment, and the SORI of the wafers. Then, there are obtained based on said relation the upper limit value (x) and lower limit value (y) of the initial Oi, which intersect in the region that simultaneously satisfy the limit value (a) of the SORI and the BMD density range (b), said upper and lower limit values (x) and (y) being determined when said limit value (a) and said density range (b) are specified, being restricted by the device yield and the gettering capability. On the other hand, in a relation which has previously been obtained similarly for each period of time of preheat treatment between the initial Oi in the wafers and the BMD density, the silicon wafers having the initial Oi in said upper limit value (x) and lower limit value (y) are subject to a preheat treatment relying on the heat treatment time intersecting in the region of simultaneously satisfying a predetermined range (c) between the upper limit value (x) and lower limit value (y) of said initial Oi, and the BMD density range (b).

By the phrase "preheat treatment" in the present invention is meant a heat treatment before the device process (including the simulation heat treatment).

Further, use of a light scattering tomography method employing infrared laser will clarify the judgment in measuring said BMD density.

BEST MODE TO CARRY OUT THE INVENTION

FUNCTION

Figure 1:
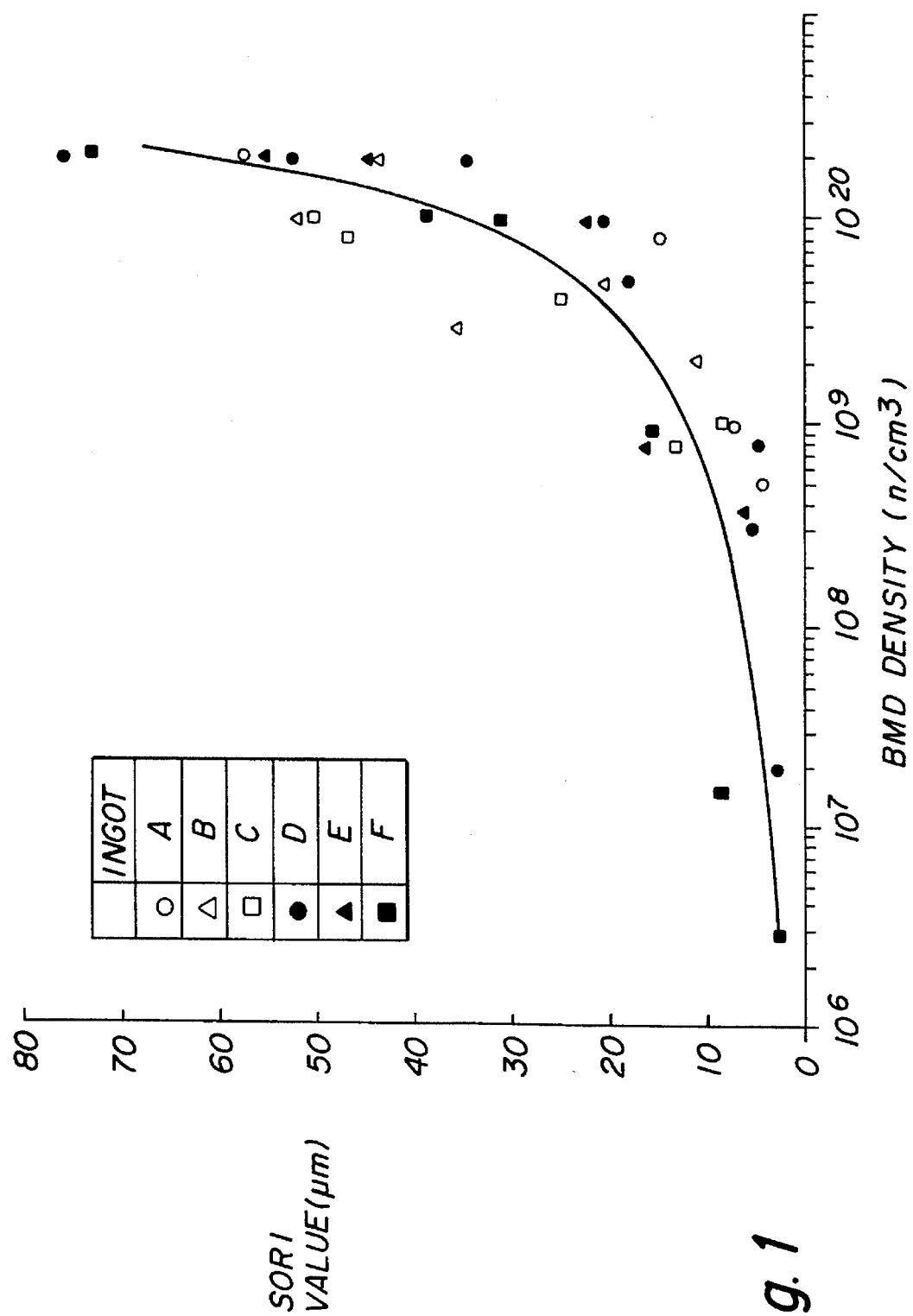
FIG. 1 shows a relation between the BMD density in wafers and the SORI of said wafers.

As will be understood from FIG. 1 (Warpage of Czochralski—Grown Silicon Wafers as Affected by oxygen Precipitation: Japanese Journal of Applied Physics, Vol. 24, No. 7, July, 1985, P. 818), it is known that referring to the relationship between the BMD density and the SORI of a wafer said SORI increases as said density increases.

The inventors of this invention have made a research further in detail as to said relationship, and as a result, they have found that even if the BMD density is the same a difference occurs in the SORI values of a wafer after it is subjected to a simulation heat treatment because of the different initial oxygen concentrations. This result appears in FIG. 2. FIG. 3 is a graph where the amount of precipitated oxygen is taken in the axis of the abscisass. It will be found from FIG. 3 that even in the case of the same BMD density and the same amount of oxygen precipitation the SORI of wafer after simulation heat treatment is smaller in the lower initial Oi in the wafer. By the simulation heat treatment referred to herein is meant a heat treatment process as illustrated in FIG. 4. This heat treatment is conventionally, most generally adopted in the business circles of this technical field, as the one where steps of device process are simulated.

As abovementioned, even in the same BMD density the SORI of wafer after simulation heat treatment becomes smaller in the lower initial Oi in the wafer, and therefore, to decrease the SORI as much as possible it results in that advantageously wafers lowest in initial Oi are selected for the presentation to the manufacturing. Practically, however, wafers of too low initial Oi need to take an extremely long period of time for a preheat treatment which is effected before the simulation heat treatment, so that in selecting the lower initial oxygen concentration there naturally is a lower limit from the viewpoint of productivity. If conversely the wafers are of too high initial Oi the wafers are greatly warped even if the BMD density could be insured with a heat treatment of a shorter period of time, or the wafers themselves become brittle, so that there is also a suitable upper limit in the too high initial oxygen concentration.

Now, if, in a first step, the wafer SORI and the BMD density in the simulation heat treatment to be an index or in the heat treatment in the processing are specified in certain desired ranges being required by the device yield or the gettering capability, the range of the initial Oi to satisfy said ranges becomes limited. It is added that generally the initial oxygen concentration is in the range from $1 \times 10^{17}$ to $20 \times 10^{17}$ atoms/cc.

Then, if, in a second step, there is obtained a preheat treatment time simultaneously satisfying the initial Oi range and the desired BMD density range both limited in the first step, in view of the relation between the initial Oi and the BMD density obtained previously for every period of time of preheat treatment, said period of time obtained becomes a preheat treatment condition for insuring the desired BMD density and limiting the SORI below a desired range.

Thus, the feature of the present invention is to subject the wafer in the initial Oi range chosen in the first step to a preheat treatment for the period of time obtained in the second step.

EXAMPLE 1

CZ silicon mirror wafers (polished wafers) of $3.5 \times 10^{17}$ to $17.5 \times 10^{17}$ atoms/cc in initial Oi range, ø 5" diameter, crystallographic axis <100>, P-type, and resistivity in the range 2–6Ω.cm were subjected, being divided in initial oxygen concentrations, to a preheat treatment for 0.5 to 78 hours at 650° C. respectively.

Figure 2:
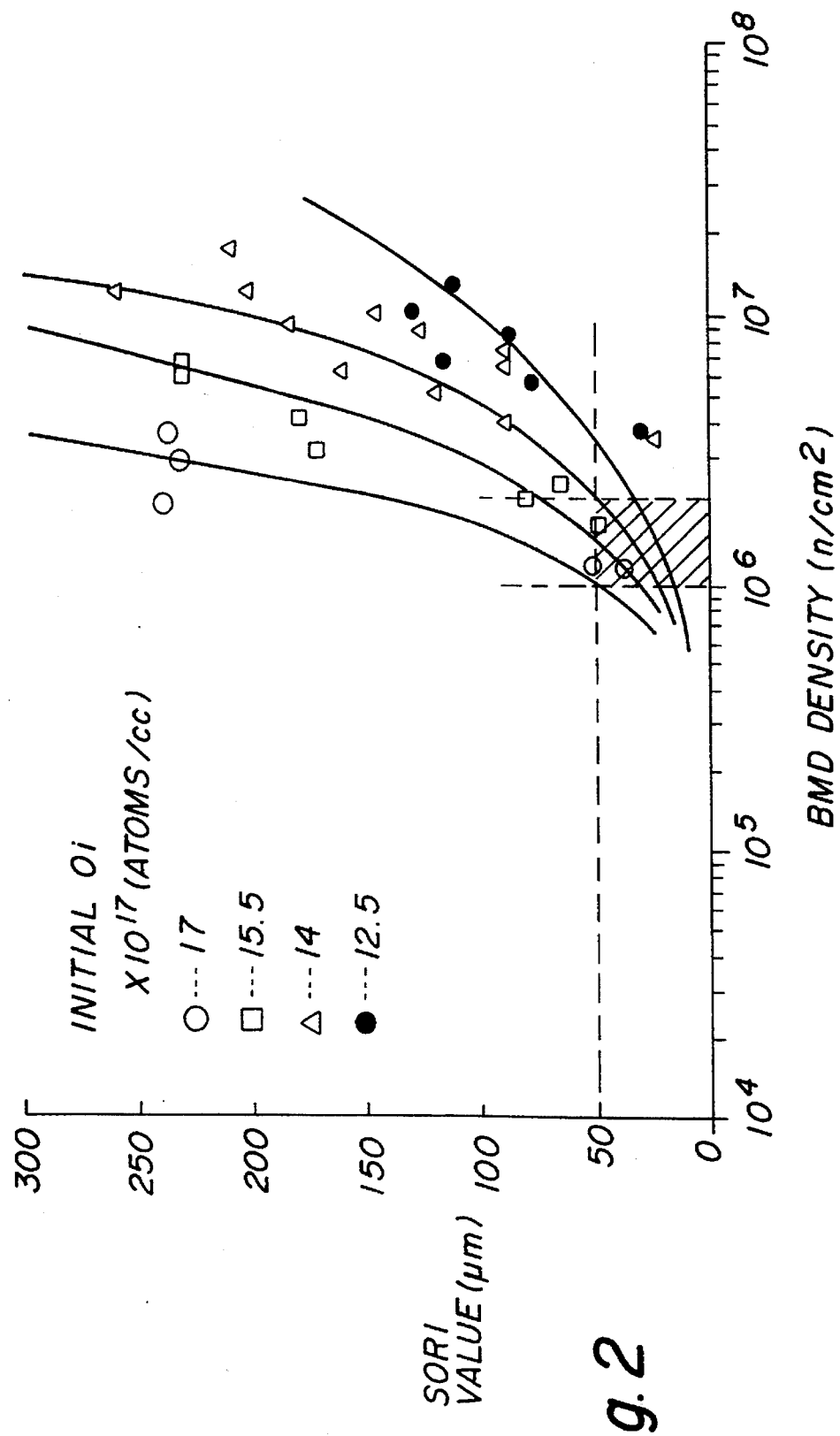
FIG. 2 is a graph showing a relation between the BMD density in the wafers and the SORI of said wafers for every initial Oi.
Figure 3:
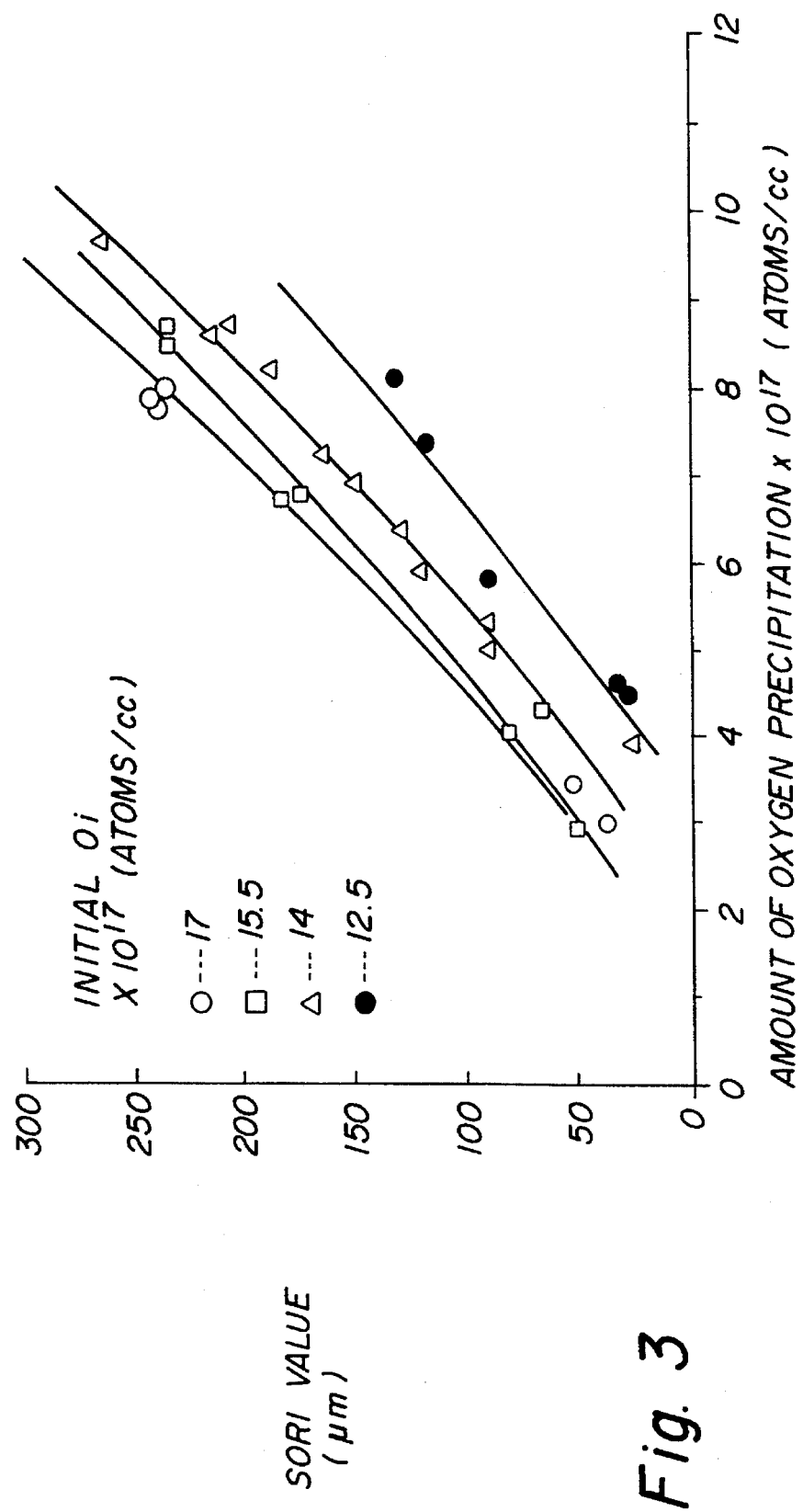
FIG. 3 is a graph showing a relation between the BMD density in the wafers and the amount of oxygen precipitation for every initial Oi.
Figure 4:
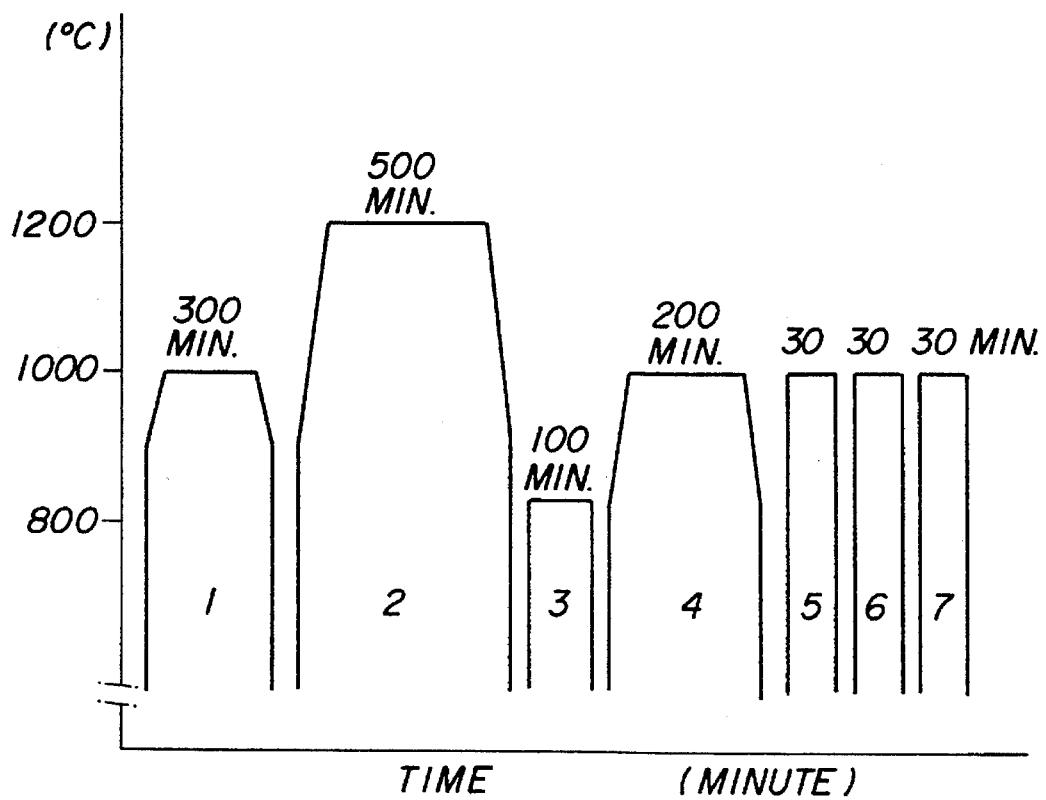
FIG. 4 is a graph showing a simulation heat treatment.

Then said wafers were thermally treated (hereinafter called C-MOS simulation) on the assumption of the DRAM manufacturing processing shown in FIG. 4 thereby to obtain a relationship among the wafer SORI generated by the thermal stress, the BMD density in the wafers, and the amount of oxygen precipitation, a result of which is as shown in FIGS. 2 and 3.

It will be found from this Example that if the initial oxygen concentrations differ the wafers also differ in their SORI even in the case of the same BMD density after heat treatment. This means that lower initial Oi provides smaller SORI.

Figure 5:
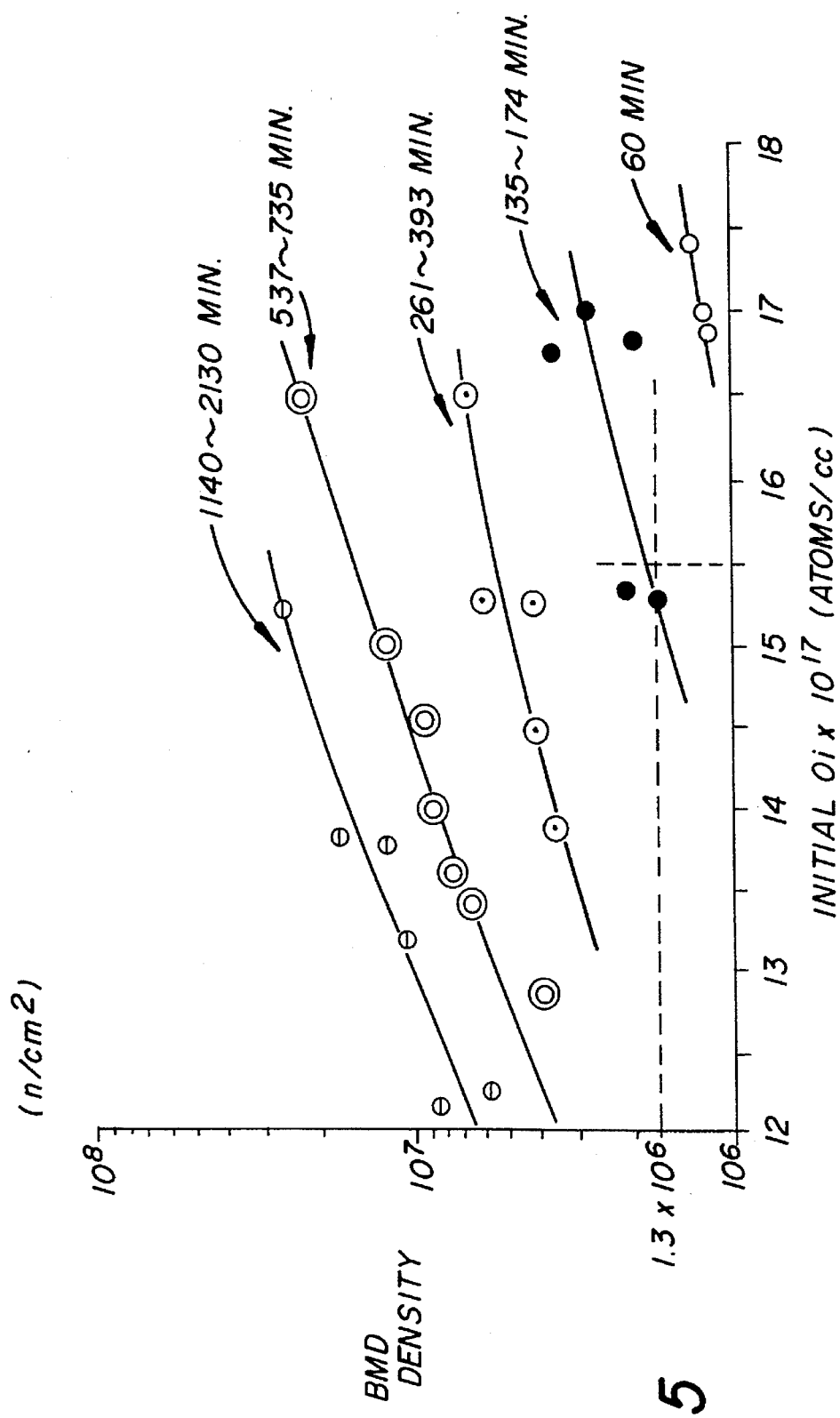
FIG. 5 is a graph showing a relation between the initial Oi in the wafers and the BMD density for every preheat treatment time.

Additionally, FIG. 5 shows a graph where the initial Oi is taken in the axis of the abscissas and the BMD density is taken in the axis of the ordinates, and the relation therebetween is illustrated for every period of preheat treatment time at 650° C.

EXAMPLE 2

Usually, the BMD density in the silicon wafers presented to the manufacturing of, for example, DRAM, is approximately in the range from $1 \times 10^6$ to $2 \times 10^6$ n/cm$^2$.

If, in view of the relation shown in FIG. 2 of Example 1, the BMD density is in the range from $1 \times 10^6$ to $2 \times 10^6$ n/cm$^2$ and the SORI is required, for example, by less than 50 μm, it is evident that to satisfy the area (the slant line portion in FIG. 2) surrounded by the axis of abscissas and the axis of ordinates, the wafers are limited to those whose initial Oi is less than $17 \times 10^{17}$ atoms/cc. It will also be evident that an initial Oi of at least more than $10 \times 10^{17}$ atoms/cc is necessary. Therefore, when wafers whose initial Oi is less than $17 \times 10^{17}$ atoms/cc and more than $10 \times 10^{17}$ atoms/cc, for example whose initial Oi is $15.5 \times 10^{17}$ atoms/cc, are chosen, it will be clear that the wafers of said $1 \times 10^6$ to $2 \times 10^6$ n/cm$^2$ are limited particularly to $1 \times 10^6$ to $1.3 \times 10^6$ n/cm$^2$ in the BMD density range in order that the SORI value is less than 50 μm, if the intersecting area marked with said slant lines is observed from the axis of the abscissas.

The invention will be described with reference to FIG. 5. It will be evident from the curve partitioned with the BMD density range of $1 \times 10^6$ to $1.3 \times 10^6$ n/cm$^2$ and intersecting with the line of said initial Oi $15.5 \times 10^{17}$ atoms/cc that to insure the desired BMD density it suffices to adopt 135 to 175 minutes as the period of preheat treatment time at 650° C. for the wafers of the initial Oi being $15.5 \times 10^{17}$ atoms/cc.

EXAMPLE 3

25 CZ silicon wafers (of ø5" diameter, crystallographic axis <100>, P-type, and resistivity 2–6Ω.cm) whose initial Oi is less than $16 \times 10^{17}$ atoms/cc and more than $12 \times 10^{17}$ atoms/cc, were subjected to a preheat treatment at every periods of time at 650° C. for every initial oxygen concentration, which periods of time were obtained in the manner of Example 2, and the wafers were formed with DRAM whereby the yield was observed with regard to the elements of 206 n/sheet.

As a result, the quality devices were 187 n on average of 25 pieces and the yield was more than 90%.

The SORIs of the wafers were all less than 50 μm while the BMD density fell under the range from $1 \times 10^6$ to $2 \times 10^6$ n/cm$^2$. That is, referring to FIG. 2, the relation thereof fits in the slant line area.

COMPARATIVE EXAMPLE 1

CZ silicon mirror wafers (polished wafers) (of ø5" diameter, crystallographic axis <100>, P-type, and resistivity 2–6 Ω.cm) whose initial Oi is less than $16 \times 10^{17}$ atoms/cc and more than $12 \times 10^{17}$ atoms/cc, were suitably subjected to a preheat treatment at 650° C. in a way that only the BMD comes under the range from $1 \times 10^6$ to $2 \times 10^6$ n/cm$^2$, and said wafers were formed with DRAM elements whereby the yield was observed with regard to the elements of 206 n/sheet.

As a result, the quality devices were 132 n on average of 25 pieces and the yield was 64%.

Though the BMD density fell within the range from $1 \times 10^6$ to $2 \times 10^6$ n/cm$^2$, almost half of the SORIs of the wafers was more than 50 μm.

COMPARATIVE EXAMPLE 2

CZ silicon mirror wafers (polished wafers) (of ø5" diameter, crystallographic axis <100>, P-type, and resisitivity 2–6 Ω.cm) whose initial Oi is more than $17 \times 10^{17}$ atoms/cc, were suitably subjected to a preheat treatment at 650° C. in such a way that only the BMD density comes within the range from $1 \times 10^6$ to $2 \times 10^6$ n/cm$^2$, and said wafers were formed with DRAM whereby the yield was observed with regard to the devices of 206 n/piece.

As a result, the quality devices were 21 n on average of 25 pieces and the yield was only 10%.

Though the BMD density came under the range from $1 \times 10^6$ to $2 \times 10^6$ n/cm$^2$, almost all of the SORIs of the wafers were greater than 50 μm.

COMPARATIVE EXAMPLE 3

It was tried to effect a preheat treatment suitably at 650° C. in such a manner that only the BMD density comes under the range from $1 \times 10^6$ to $2 \times 10^6$ n/cm$^2$, to CZ silicon mirror wafers (polished wafers) (of ø5" diameter, crystallographic axis <100>, P-type, and resisitivity 2–6 Ω.cm) whose initial Oi is less than $12 \times 10^{17}$ atoms/cc. However, it took an extremely long period of time for such trial, to find that such wafers could hardly be usable when viewed from the standpoint of productivity.

Additionally, though the BMD density in the wafers were measured in the respective Examples and Comparative Examples by using a light scattering tomography method, an etching method may be substituted therefor.

Though each of said Examples is the one to apply the present invention to the manufacture of DRAM it was found that in SRAM the suitable BMD density is in the range from $2 \times 10^6$ to $5 \times 10^6$ n/cm$^2$, and if the manufacturing steps are of high cleanness it is in the range from $1 \times 10^4$ to $5 \times 10^4$ n/cm$^2$. That is depending on the kinds of respective devices or the cleanliness in the manufacturing steps the optimum BMD density is required for the wafers. FIG. 2 used in the Examples expresses a relationship between the BMD density and SORI of wafers in the C-MOS simulation on the assumption of DRAM, and it is possible to easily obtain a relationship between the BMD density and the SORI by suitably adopting proper simulations for respective elements of SRAM, mask ROM, BIPOLAR, etc.

The relationship between the BMD density and the SORI slightly varies according to the thermal treatment conditions in the manufacture of the respective elements or the kinds of wafers employed in manufacturing devices, but the dependency upon the initial oxygen concentration was the same in all simulations.

In order to secure a certain BMD density that is required from the gettering capability a suitable selection may be possible by combining the initial Oi in the wafer with the preheat treatment condition. However, in using the present process it is capable of efficiently selecting, at a short period of time, without relying on trial and error, a combination of said various conditions for restraining the SORI of wafer minimum and securing the BMD density necessary for the manifestation of a desired gettering capability.

According to the present invention, wafers are chosen on the basis of the initial oxygen concentration in wafer, as a target, said concentration co-relating with the occurrence of SORI, and finally the time of preheat treatment in making devices is determined, so that as will be clear even from the Examples, the yield is improved and the productivity is enhanced compared with known processes.

Though the present invention has been described mainly in respect of SORI of wafer, but according to the invention it is also possible to cope similarly with a slip to be continuous defects caused by the SORI.

Moreover, though the temperature of preheat treatment has been fixed to determine the time for the preheat treatment in the invention, it is capable of determining the optimum time for the preheat treatment even if said temperature changes, by means of a similar operation in response to the change of temperature.

Figure 6:
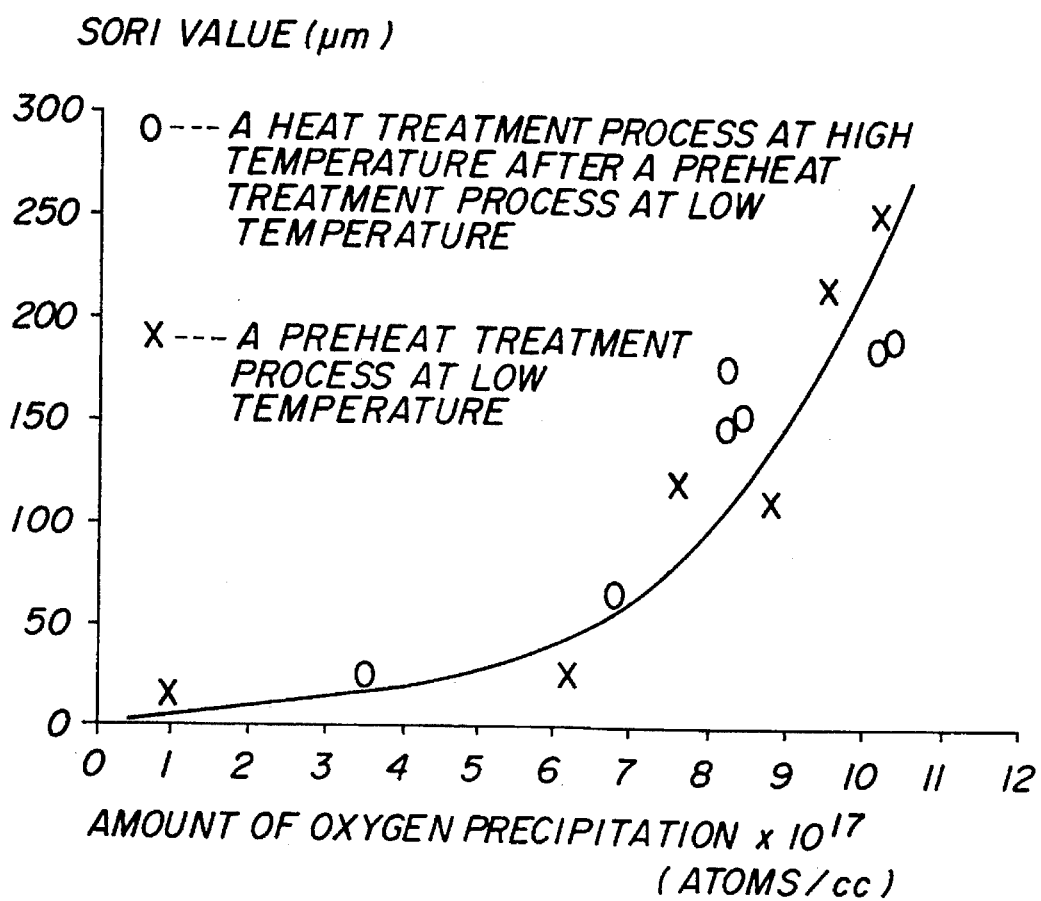
FIG. 6 is a graph showing a relation between the SORI of the wafers and the amount of oxygen precipitation.

Further, it is possible to apply the present invention even to wafers subjected to a heat treatment at high temperature (usually higher than 1,100° C.) for the outward diffusion of oxygen before the preheat treatment for the formation of an oxygen precipitate nucleus thereby setting the optimum preheat treatment conditions without relying on trial and error. This is because that it has been confirmed with a C-MOS simulation, as shown in FIG. 6, that any difference does not occur in the relationship between the SORI value and the amount of oxygen precipitaiton if the initial oxygen concentration remains the same, irrespective of entry or non-entry into a heat treatment process at high temperature before the preheat treatment for the formation of an oxygen precipitate nucleus.

INDUSTRIAL USABILITY OF THE INVENTION

The present invention is applied in manufacturing semiconductor devices.

We claim:

1. A process for manufacturing a semiconductor device characterized in that when a SORI limit value of a silicon single crystal wafer in manufacturing devices and a bulk micro defect density are defined in fixed ranges for said wafer, as required by the device yield and the gettering capability, said wafer having an initial oxygen concentration capable of simultaneously satisfying said fixed ranges is subjected to preheat treatment for the formation of an oxygen precipitate nucleus by using a time capable of simultaneously satisfying a predetermined fixed range between the upper and lower limit values of said initial oxygen concentration and the predetermined fixed range of said bulk micro defect density.

2. A process for manufacturing a semiconductor device as set forth in claim 1 wherein the SORI limit value of the wafer is not higher than 300 μm, and the bulk micro defect density is not greater than $10^{10}$ n/cm$^2$.

\* \* \* \* \*